United States Patent
Fay et al.

(10) Patent No.: US 12,400,877 B2
(45) Date of Patent: *Aug. 26, 2025

(54) SEMICONDUCTOR DEVICES WITH FLEXIBLE REINFORCEMENT STRUCTURE

(71) Applicant: Micron Technology, Inc., Boise, ID (US)

(72) Inventors: Owen R. Fay, Meridian, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/668,887

(22) Filed: May 20, 2024

(65) Prior Publication Data

US 2024/0304465 A1 Sep. 12, 2024

Related U.S. Application Data

(63) Continuation of application No. 18/106,225, filed on Feb. 6, 2023, now Pat. No. 11,990,350, which is a
(Continued)

(51) Int. Cl.
*H01L 21/00* (2006.01)
*H01L 21/56* (2006.01)
(Continued)

(52) U.S. Cl.
CPC .............. *H01L 21/56* (2013.01); *H01L 21/78* (2013.01); *H01L 23/291* (2013.01); *H01L 23/293* (2013.01); *H01L 23/3114* (2013.01)

(58) Field of Classification Search
None
See application file for complete search history.

(56) References Cited

U.S. PATENT DOCUMENTS 6,627,998 B1 9/2003 Caletka et al.
6,720,270 B1 * 4/2004 Chang ..................... H01L 24/96
257/E23.021
(Continued)

FOREIGN PATENT DOCUMENTS

CN 102132403 A 7/2011
WO 2020025889 A1 2/2020

OTHER PUBLICATIONS

CN Patent Application No. 202110630447.7—Chinese Office Action and Search Report, issued Aug. 14, 2024, with English Translation, 21 pages.
(Continued)

*Primary Examiner* — Nicholas J Tobergte
(74) *Attorney, Agent, or Firm* — Dorsey & Whitney LLP

(57) ABSTRACT

Methods for manufacturing semiconductor devices having a flexible reinforcement structure, and associated systems and devices, are disclosed herein. In one embodiment, a method of manufacturing a semiconductor device includes electrically coupling at least one semiconductor die to a redistribution structure on a first carrier. The semiconductor die can include a first surface facing the redistribution structure and a second surface spaced apart from the redistribution structure. The method also includes reducing a thickness of the semiconductor die to no more than 10 μm. The method further includes coupling a flexible reinforcement structure to the second surface of the at least one semiconductor die.

20 Claims, 7 Drawing Sheets

Related U.S. Application Data continuation of application No. 16/896,043, filed on Jun. 8, 2020, now Pat. No. 11,574,820.

(51) Int. Cl.
  *H01L 21/78* (2006.01)
  *H01L 23/29* (2006.01)
  *H01L 23/31* (2006.01)

(56) References Cited

U.S. PATENT DOCUMENTS

| | | | |
|---|---|---|---|
| 8,338,929 | B2 | 12/2012 | Chen et al. |
| 9,530,708 | B1* | 12/2016 | Sharifi ............... H01L 23/12 |
| 11,574,820 | B2* | 2/2023 | Fay .................. H01L 23/3114 |
| 2010/0009497 | A1* | 1/2010 | Dimmler ............. H10K 71/135 |
| | | | 257/E51.006 |
| 2012/0074592 | A1* | 3/2012 | Luan ..................... H01L 24/97 |
| | | | 257/777 |
| 2013/0037936 | A1 | 2/2013 | Choi et al. |
| 2013/0200528 | A1 | 8/2013 | Lin et al. |
| 2015/0049443 | A1 | 2/2015 | Meyer-Berg |
| 2016/0043018 | A1 | 2/2016 | Sajedi |
| 2016/0358889 | A1* | 12/2016 | Lai ..................... H01L 21/768 |
| 2017/0110416 | A1 | 4/2017 | Miao et al. |
| 2018/0261446 | A1* | 9/2018 | Du ...................... H01L 23/14 |
| 2020/0027852 | A1 | 1/2020 | Chen et al. |
| 2021/0378101 | A1* | 12/2021 | Souriau ............. H01L 21/6835 |
| 2021/0384043 | A1 | 12/2021 | Fay et al. |
| 2023/0187224 | A1 | 6/2023 | Fay et al. |

OTHER PUBLICATIONS

CNIPA notice of allowance and search report issued for Chinese application No. 202110630447.7, 4 pages.

* cited by examiner

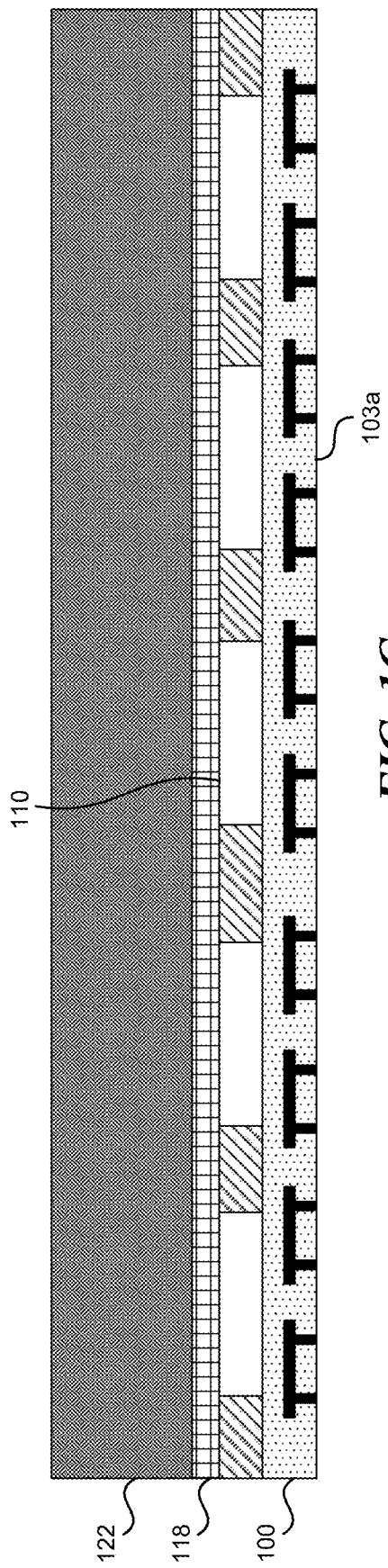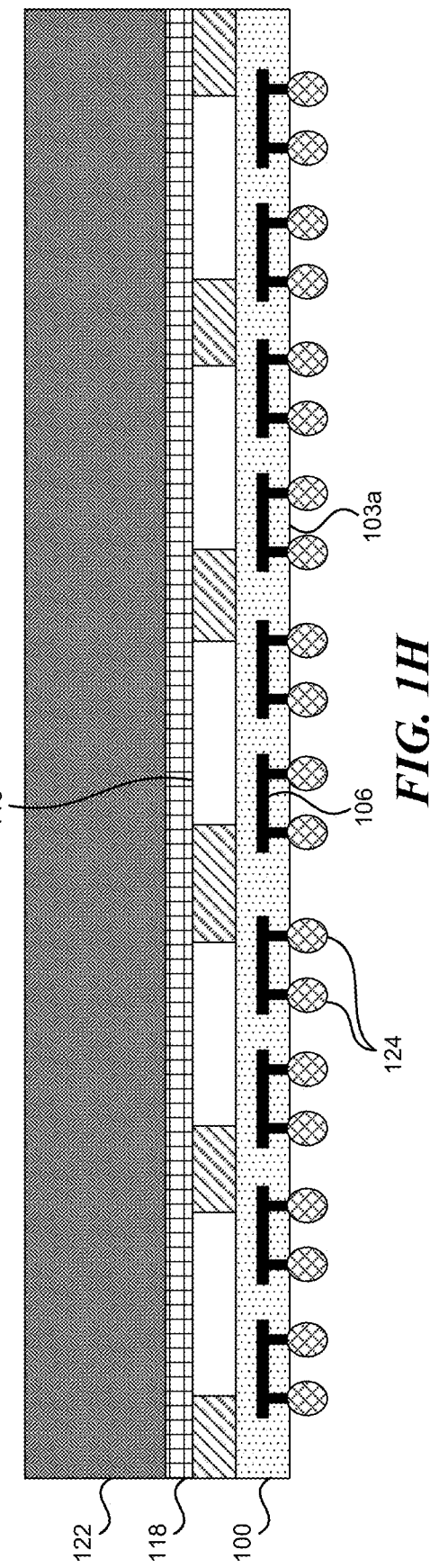

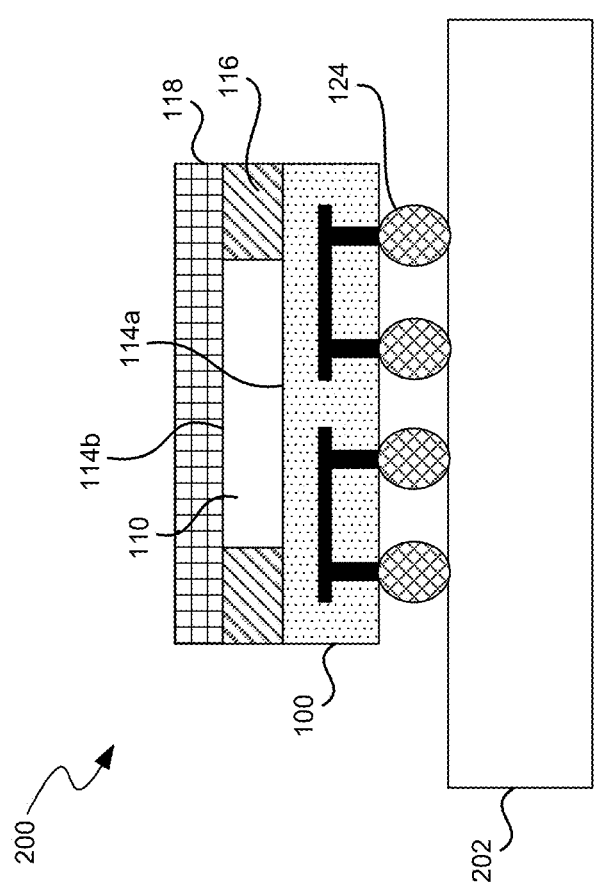

SEMICONDUCTOR DEVICES WITH FLEXIBLE REINFORCEMENT STRUCTURE

CROSS-REFERENCE TO RELATED APPLICATIONS

This application is a continuation of U.S. patent application Ser. No. 18/106,225, filed Feb. 6, 2023; which is a continuation of U.S. patent Ser. No. 16/896,043, filed Jun. 8, 2020, now U.S. Pat. No. 11,574,820; each of which is incorporated herein by reference in its entirety.

TECHNICAL FIELD

The present technology generally relates to semiconductor devices, and more particularly relates to semiconductor devices having a flexible reinforcement structure coupled to the semiconductor die.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

During the manufacturing process, the semiconductor die can be thinned (e.g., by back grinding) to reduce the overall thickness of the semiconductor package. However, thinner semiconductor dies may be more prone to chipping, cracking, or other damage during subsequent processing steps. Semiconductor packages with thinner semiconductor dies may be also more prone to failure from thermomechanical stresses (e.g., chip-package interaction (CPI) stresses).

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 1G is a side cross-sectional view of the semiconductor dies of FIG. 1F after separation from the first carrier in accordance with embodiments of the present technology.

FIG. 1H is a side cross-sectional view of the semiconductor dies of FIG. 1G coupled to an array of electrical connectors configured in accordance with embodiments of the present technology.

FIG. 2 is a side cross-sectional view of a semiconductor device configured in accordance with embodiments of the present technology.

DETAILED DESCRIPTION

Figure 1A:
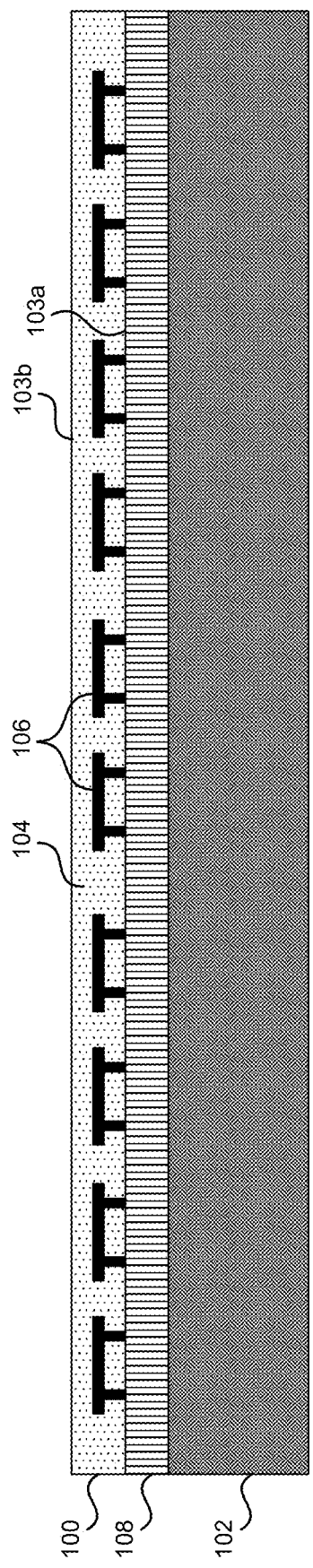
FIG. 1A is a side cross-sectional view of a redistribution structure formed on a first carrier and configured in accordance with embodiments of the present technology.

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In several of the embodiments described below, a method of manufacturing a semiconductor device includes electrically coupling one or more semiconductor dies to a redistribution structure on a first carrier. Each semiconductor die can have a first surface (e.g., an active side or surface) connected to the redistribution structure and a second surface (e.g., a back side or surface) spaced apart from the redistribution structure. The method can also include reducing a thickness of each semiconductor die, such as by grinding or otherwise removing material from the second surface of the semiconductor die. After the thinning process, a flexible reinforcement structure can be coupled to the second surface of the semiconductor dies, and the flexible reinforcement structure can remain attached to the semiconductor dies during subsequent manufacturing steps and/or with the final semiconductor device. The present technology is expected to reduce chipping, cracking, or other damage or failures in the semiconductor dies contributing to yield loss during the manufacturing process. Additionally, the embodiments described herein can be used to reliably produce very thin semiconductor dies (e.g., no more than 10 µm thick) suitable for use in a single die package (SDP) or system in package (SiP) for flexible electronics applications or other applications where thin dies are desirable. In some embodiments, the techniques described herein can be used to produce substrate-less semiconductor packages (e.g., packages in which the semiconductor die is mounted directly to a printed circuit board or flexible circuit without any intermediate package substrate).

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-3. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIGS. 1A-1I are side cross-sectional views illustrating various stages in a method of manufacturing a semiconductor device in accordance with embodiments of the present technology. A semiconductor device can be manufactured, for example, as a discrete device or as part of a larger wafer or panel. In wafer-level or panel-level manufacturing, multiple semiconductor dies are packaged on a wafer or panel before being singulated into a plurality of individual devices. Although FIGS. 1A-1I illustrate a manufacturing process involving five semiconductor dies, in practice the process can be scaled or otherwise adapted for any suitable number of semiconductor dies (e.g., a single semiconductor die, tens or hundreds of semiconductor dies, etc.).

Referring to FIG. 1A, a redistribution structure 100 (shown schematically) is formed on a first carrier 102. The redistribution structure 100 includes a first surface 103a (e.g., a lower surface) connected to the first carrier 102 and a second surface 103b (e.g., an upper surface) away from the first carrier 102. The redistribution structure 100 can be fabricated directly on the first carrier 102 using any suitable additive manufacturing process, such as sputtering, physical vapor deposition (PVD), electroplating, lithography, etc.

In some embodiments, the redistribution structure 100 is or includes a redistribution layer (RDL) configured for fan-out wafer-level packaging in accordance with techniques known to those of skill in the art. The redistribution structure 100 can include one or more layers of an insulating material 104 and one or more layers of conductive elements 106 (e.g., contacts, traces, pads, vias, etc.). The insulating material 104 can separate and electrically isolate the conductive elements 106 from each other. The insulating material 104 can be made of any suitable non-conductive dielectric material, such as parylene, polyimide, or low temperature chemical vapor deposition (CVD) materials (e.g., tetraethylorthosilicate (TEOS), silicon nitride, silicon oxide). The conductive elements 106 can be made of any suitable conductive material, such as one or more metals (e.g., copper, silver, titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the redistribution structure 100 is configured to be flexible and can undergo a certain amount of deformation (e.g., elastic and/or plastic deformation) while remaining fully operational. For example, the insulating material 104 can be made of a flexible polyimide dielectric material and the conductive elements 106 can be made of thin copper or flexible silver paste.

The first carrier 102 can be a wafer or other structure that temporarily provides mechanical support to the redistribution structure 100 and/or other semiconductor components for subsequent processing stages. The first carrier 102 can be formed from any suitable material, such as silicon, silicon-on-insulator, compound semiconductor materials (e.g., gallium nitride), glass, or quartz. In some embodiments, the first carrier 102 is temporarily coupled to the redistribution structure 100 via a release layer 108. The release layer 108 can be configured to be selectively dissolved, debonded, or otherwise separated from the redistribution structure 100 upon application of a suitable stimulus (e.g., heat, light) or agent (e.g., a solvent, an acid, water) so that the redistribution structure 100 can be removed from the first carrier 102, as described in greater detail below. The release layer 108 can be made of any suitable material, such as an adhesive, a polymer, an epoxy, a film, a tape, a paste, etc.

Figure 1B:
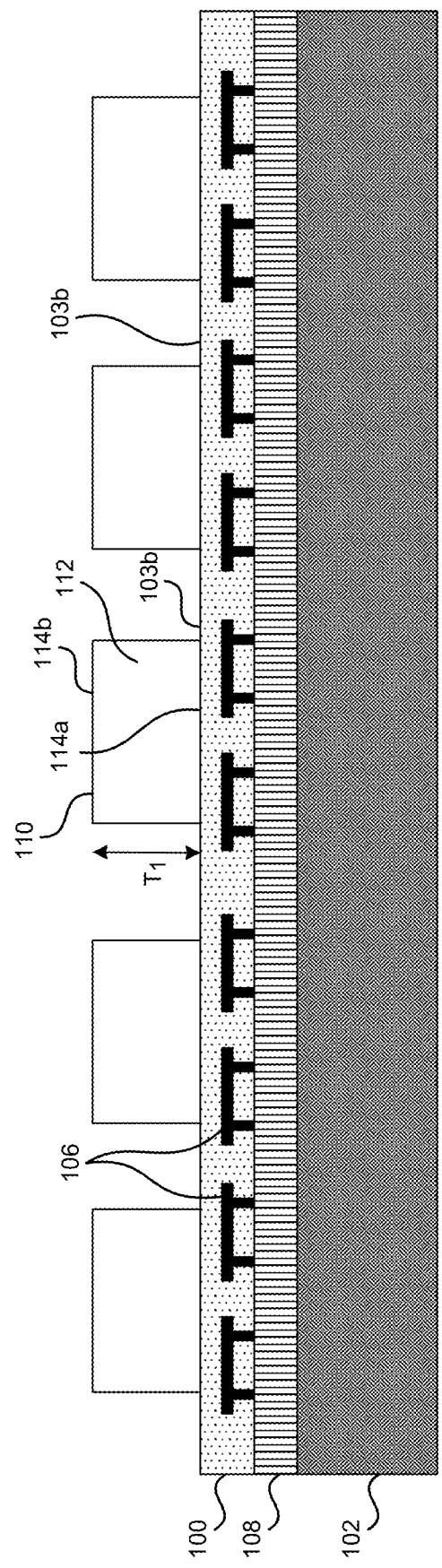
FIG. 1B is a side cross-sectional view of semiconductor dies coupled to the redistribution structure of FIG. 1A and configured in accordance with embodiments of the present technology.

Referring to FIG. 1B, a plurality of semiconductor dies 110 are mechanically and electrically coupled to the redistribution structure 100. The semiconductor dies 110 can be spaced apart from each other across the surface of the redistribution structure 100, e.g., distributed in accordance with wafer-level or panel-level manufacturing processes. Each semiconductor die 110 includes a semiconductor substrate 112 (e.g., a silicon substrate, a gallium arsenide substrate, an organic laminate substrate, etc.) having a first side or surface 114a (e.g., a lower surface) and a second side or surface 114b (e.g., an upper surface). Each semiconductor die 110 can be relatively thick, e.g., the initial thickness $T_1$ of the semiconductor die 110 can be greater than or equal to 750 μm.

In some embodiments, the first surface 114a of each semiconductor die 110 is connected to the second surface 103b of the redistribution structure 100 while the second surface 114b is away from the redistribution structure 100. The first surface 114a can be an active side, surface, or region that includes various types of semiconductor components such as memory circuits, (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features. In some embodiments, the first surface 114a includes contacts (e.g., bond pads—not shown) for electrically coupling the semiconductor die 110 to the conductive elements 106 of the redistribution structure 100. The first surface 114a can be electrically coupled to the redistribution structure 100 using any suitable bonding technique known to those of skill in the art (e.g., thermo-compression bonding, flip-chip bonding, etc.). The second surface 114b can be a back side or surface of the semiconductor die 110 that does not include electrically or optically active semiconductor components or features.

Figure 1C:
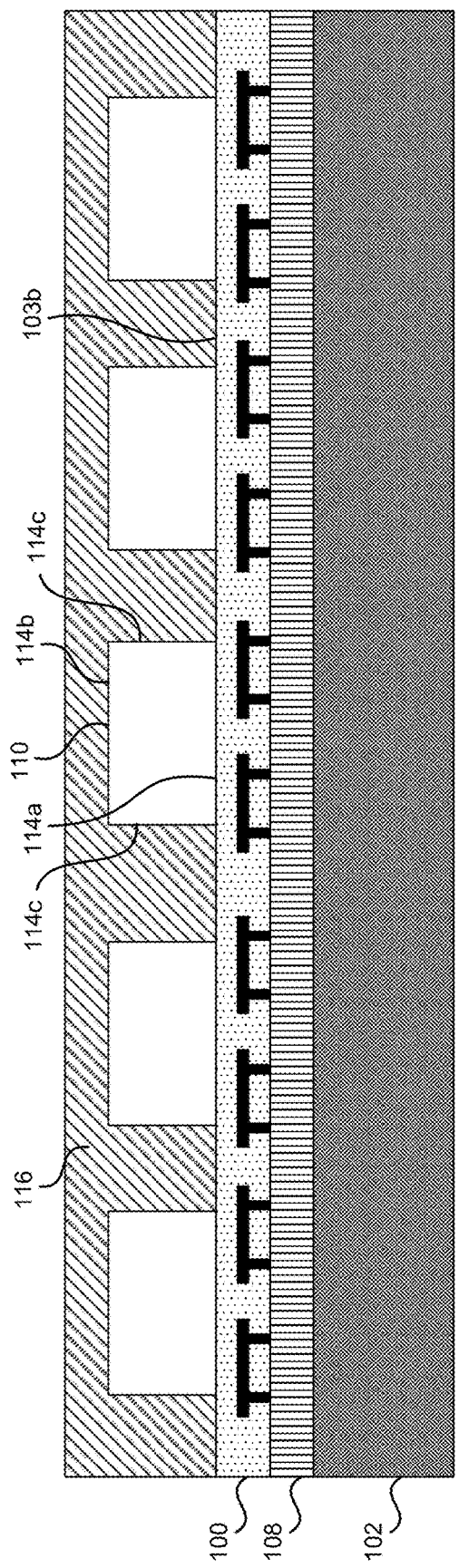
FIG. 1C is a side cross-sectional view of the semiconductor dies of FIG. 1B encapsulated in a mold material configured in accordance with embodiments of the present technology.

Referring to FIG. 1C, a mold material 116 can be disposed over the semiconductor dies 110 and portions of the second surface 103b of the redistribution structure 100. The mold material 116 can cover the second surface 114b and lateral surfaces 114c of each semiconductor die 110, as well as fill the spaces between individual semiconductor dies 110. The mold material 116 can be a resin, epoxy resin, silicone-based material, polyimide, or any other material suitable for encapsulating the semiconductor dies 110 and/or at least a portion of the redistribution structure 100 to protect these components from contaminants and/or physical damage. Once deposited, the mold material 116 can optionally be cured by UV light, chemical hardeners, heat, or other suitable curing methods known in the art.

Figure 1D:
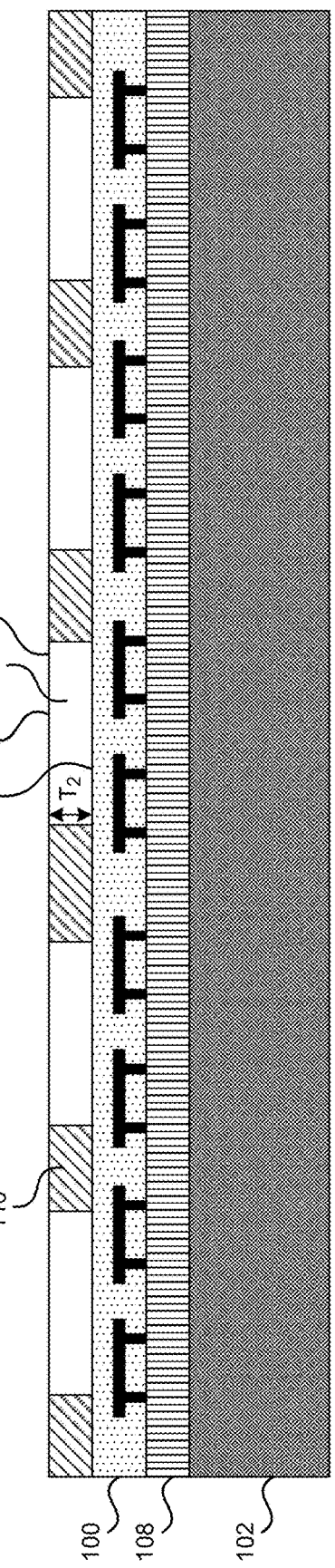
FIG. 1D is a side cross-sectional view of the semiconductor dies of FIG. 1C after thinning in accordance with embodiments of the present technology.

FIG. 1D shows the assembly after the thickness of each semiconductor die 110 has been reduced by removing material from the semiconductor substrate 112. In some embodiments, the thinning process can involve removing portions of the semiconductor substrate 112 that do not include any active semiconductor components (e.g., portions at or near the second surface 114b) while leaving the portions of the semiconductor substrate 112 that include active components (e.g., portions at or near the first surface 114a). The thinning process can also involve removing some of the mold material 116. For example, portions of the mold material 116 over the second surface 114b can be removed so that the second surface 114b is exposed for thinning the semiconductor dies 110 and subsequent manufacturing processes. Thinning of the semiconductor dies 110 can be accomplished via techniques known to those of skill in the art such as grinding (e.g., back grinding of the second surface 114b), dry etching, chemical etching, or chemical mechanical polishing (CMP).

The final thickness $T_2$ of the semiconductor die 110 can be significantly smaller than the initial thickness $T_1$. For example, the final thickness $T_2$ can be less than or equal to 50 µm, 40 µm, 30 µm, 20 µm, 15 µm, 10 µm, 5 µm, 4 µm, 3 µm, 2 µm, or 1 µm. In some embodiments, the final thickness $T_2$ is less than or equal to 10%, 5%, 4%, 3%, 2%, 1.5%, 1%, or 0.5% of the initial thickness $T_1$. Optionally, the final thickness $T_2$ can be sufficiently thin so that the semiconductor dies 110 can bend or flex for use in flexible electronics applications, non-TSV die stacking technologies, and/or other applications where very thin semiconductor dies are desirable, as described further below.

Figure 1E:
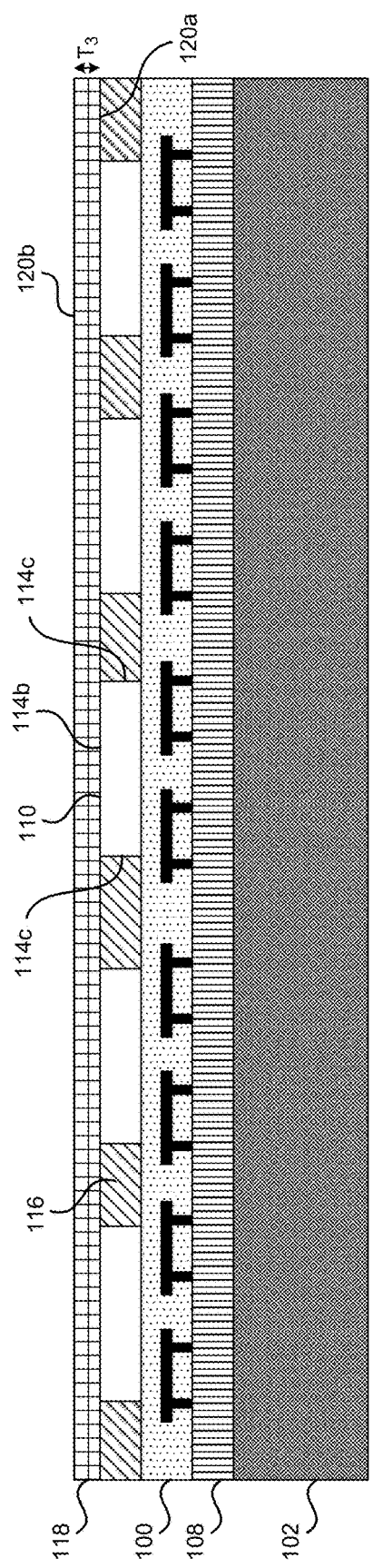
FIG. 1E is a side cross-sectional view of a reinforcement structure attached to the thinned semiconductor dies of FIG. 1D and configured in accordance with embodiments of the present technology.

Referring to FIG. 1E, at least one reinforcement structure 118 is coupled to the second surface 114b of each semiconductor die 110. The reinforcement structure 118 includes a first surface 120a (e.g., a lower surface) that contacts the semiconductor dies 110 and a second surface 120b (e.g., an upper surface) away from the semiconductor dies 110. In some embodiments, the second surface 114b of each semiconductor die 110 contacts and is covered by the reinforcement structure 118, while the lateral surfaces 114c are surrounded by the mold material 116. The reinforcement structure 118 can be configured as a layer, a sheet, a film, or any other structure having a sufficiently large surface area to cover multiple semiconductor dies 110 in a wafer-level or panel-level manufacturing process. The reinforcement structure 118 can also the cover the exposed areas of the mold material 116. The reinforcement structure 118 can be configured to support and protect the semiconductor dies 110 after thinning, e.g., to reduce or prevent cracking or chipping, mitigate the likelihood of failure due to thermomechanical stress, etc. As previously described, thin semiconductor dies (e.g., having thicknesses less than or equal to 50 µm, 35 µm, 10 µm, or 5 µm) can be particularly prone to chipping or cracking at the edges of the die in subsequent manufacturing processes. Additionally, thermomechanical stresses (e.g., CPI stresses) in subsequent manufacturing processes and/or during operation can also have a larger impact on thin semiconductor dies. Accordingly, the reinforcement structure 118 can protect the semiconductor dies 110 to reduce yield loss due to chipping, cracking, and other failures.

In some embodiments, the reinforcement structure 118 is flexible and can accommodate a certain degree of elastic and/or plastic deformation (e.g., bending) without fracturing, separating from the semiconductor die 110, or other mechanical failure. As such, the reinforcement structure 118 can be a relatively thin structure with a thickness $T_3$ less than or equal to 50 µm, 40 µm, 30 µm, 20 µm, 15 µm, 10 µm, 5 µm, 4 µm, 3 µm, 2 µm, or 1 µm. In some embodiments, the thickness $T_3$ is less than or equal to the thickness $T_2$ of the semiconductor dies 110 after thinning, e.g., thickness $T_3$ is less than or equal to 100%, 90%, 80%, 70%, 60%, 50%, 40%, 30%, 20%, or 10% of thickness $T_2$. The reinforcement structure 118 can be configured to be more flexible than a layer of silicon having an equivalent thickness.

The reinforcement structure 118 can be made of many different types of materials, such as a polymeric material (e.g., polyimide, polytetrafluoroethylene (PTFE)), a resin (e.g., epoxy resin), a laminate, a film (e.g., a die attach film), a metallic material (e.g., copper, aluminum), or a combination thereof. Optionally, the reinforcement structure 118 can be a composite material including at least one structural element (e.g., weave, fiber, particle, etc.) embedded in a matrix material (e.g., a polymer, a resin, etc.). The structural element(s) can provide mechanical strength and support, while the matrix material can surround and/or impregnate the structural element(s) to connect them to each other and/or provide flexibility. For example, the matrix material can be a polyimide or an epoxy resin, and the structural elements can be a carbon-based material (e.g., carbon weave or carbon fibers) or a glass-based material (e.g., glass weave or glass fibers). Optionally, the reinforcement structure 118 can be made of materials that are identical or generally similar to materials used in substrates for semiconductor devices (e.g., core materials used in printed circuit boards). Alternatively or in combination, the reinforcement structure 118 can be made of materials that are identical or generally similar to metals or metal alloys used in semiconductor packaging and leadframe manufacturing (e.g., a metal layer attached via a thin adhesive layer).

The reinforcement structure 118 can be coupled to the semiconductor dies 110 in various ways. For example, the reinforcement structure 118 can be provided as premade layer or sheet that is laminated or otherwise bonded onto the semiconductor dies 110 (e.g., via heating, curing, adhesives, etc.). As another example, the reinforcement structure 118 can be provided as a liquid or a semi-solid material that is coated onto the semiconductor dies 110 (e.g., by spin coating, spray coating, etc.). In a further example, the reinforcement structure 118 can be molded onto the semiconductor dies 110. The reinforcement structure 118 can optionally be attached to the semiconductor dies 110 in an uncured state, then subsequently cured (e.g., by heat, light, chemical agents, etc.). Suitable adhesion promoters can also be used to facilitate coupling of the reinforcement structure 118 to the semiconductor dies 110. In some embodiments, the second surface 114b of the semiconductor substrate 112 includes a native oxide layer, and the reinforcement structure 118 is attached to the oxide layer. In other embodiments the native oxide layer can be removed so that the reinforcement structure 118 is directly attached to the silicon of the semiconductor substrate 112. Other techniques known to those of skill in the art for fabricating a thin layer of material on the semiconductor dies 110 can also be used.

Although the illustrated embodiments show a single reinforcement structure 118, in other embodiments a different number of reinforcement structures 118 can be used (e.g., two, three, four, five, or more). The reinforcement structures 118 can each be made of the same material, or some or all of the reinforcement structures 118 can be made of different materials to impart different properties to the composite reinforcement structure (e.g., strength, flexibility, heat transfer, etc.). Likewise, the reinforcement structures 118 can each have the same thickness, or some or all of the reinforcement structures 118 can have different thicknesses. In some embodiments, the combined thickness of all the reinforcement structures 118 is sufficiently thin to maintain flexibility, e.g., less than or equal to 50 μm, 40 μm, 30 μm, 20 μm, 15 μm, 10 μm, 5 μm, 4 μm, 3 μm, 2 μm, or 1 μm.

Figure 1F:
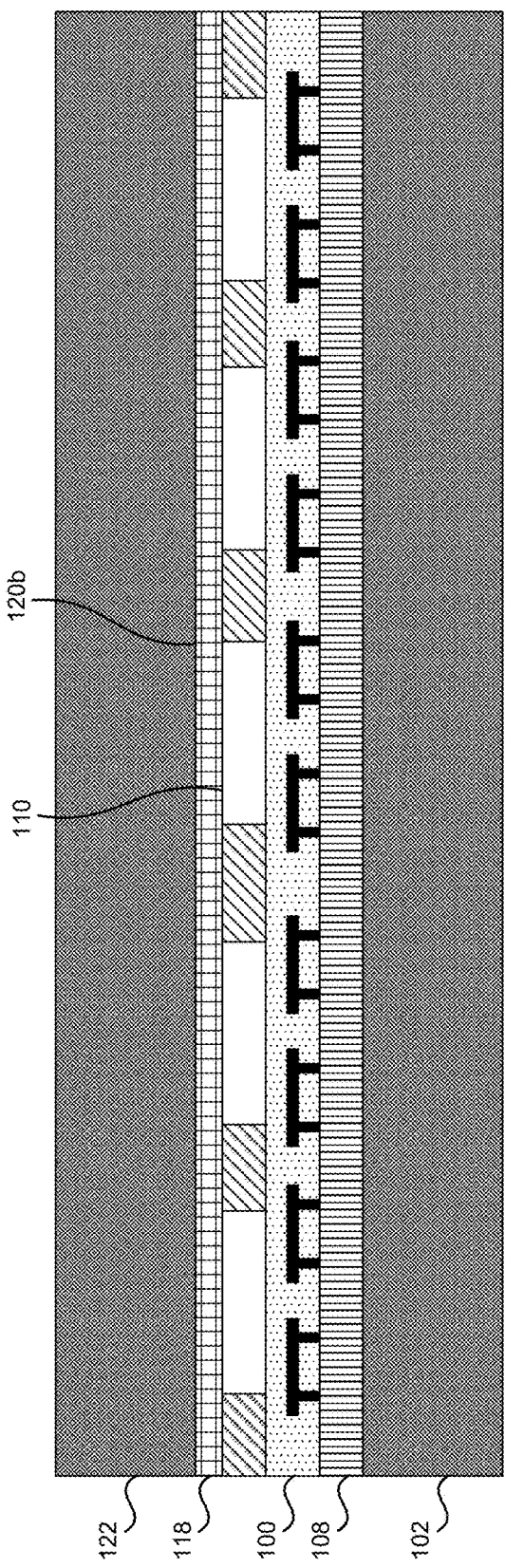
FIG. 1F is a side cross-sectional view of a second carrier attached to the reinforcement structure of FIG. 1E and configured in accordance with embodiments of the present technology.

Referring to FIG. 1F, a second carrier 122 can be coupled to the reinforcement structure 118. The second carrier 122 can be coupled to the second surface 120b of the reinforcement structure 118 away from the semiconductor dies 110. The second carrier 122 can be identical or generally similar to the first carrier 102, such as a wafer or other structure that temporarily provides mechanical support for subsequent processing stages. The second carrier 122 can be coupled directly to the flexible reinforcement structure 118, or can be indirectly coupled via a release layer (e.g., identical or generally similar to the release layer 108—not shown) in accordance with techniques known to those of skill in the art.

Referring to FIG. 1G, the first carrier 102 can be separated from the redistribution structure 100. In some embodiments, the first carrier 102 is separated by dissolving, debonding, or otherwise decoupling the release layer 108 from the redistribution structure 100, e.g., using a suitable stimulus (e.g., heat, light) or agent (e.g., solvent, water). Following removal of the first carrier 102, the semiconductor dies 110 and redistribution structure 100 remain coupled to the second carrier 122 via the reinforcement structure 118, while the first surface 103a of the redistribution structure 100 is exposed for subsequent manufacturing stages.

FIG. 1H shows the assembly after an array of electrical connectors 124 (e.g., a ball grid array) has been mechanically and electrically coupled to the redistribution structure 100. The electrical connectors 124 can include solder balls, conductive bumps, conductive pillars, conductive epoxies, and/or other suitable electrically conductive elements configured to electrically and mechanically couple the semiconductor dies 110 to a substrate or another device, in accordance with techniques known to those of skill in the art. In some embodiments, the electrical connectors 124 are electrically coupled to the conductive elements 106 of the redistribution structure 100 such that signals from the semiconductor dies 110 can be routed to the electrical connectors 124 via the redistribution structure 100. For example, the first surface 103a of the redistribution structure 100 can include contacts (e.g., bond pads—not shown) for receiving and coupling to the electrical connectors 124, and the contacts can be electrically coupled to the corresponding contacts on the semiconductor dies 110 via the conductive elements 106.

Figure 1I:
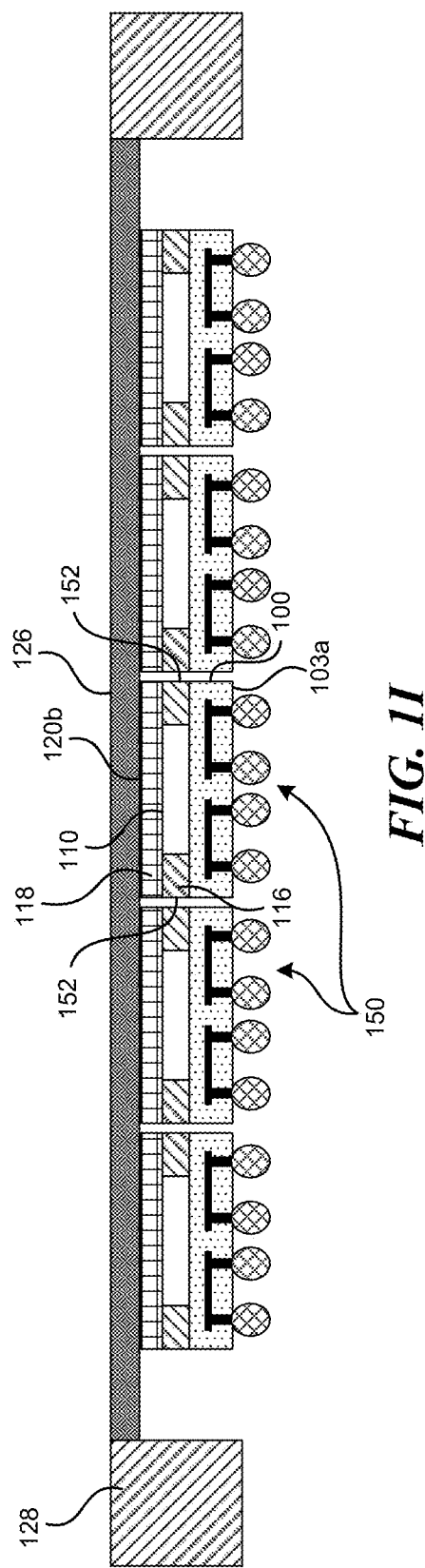
FIG. 1I is a side cross-sectional view of a plurality of semiconductor devices produced by singulating the semiconductor dies of FIG. 1H in accordance with embodiments of the present technology.

Referring to FIG. 1I, the semiconductor dies 110 can be singulated or otherwise separated from each other to form a plurality of individual semiconductor devices 150. The singulation process can involve separating the reinforcement structure 118 from the second carrier 122 (e.g., using techniques similar to those previously described with respect to the first carrier 102 and FIG. 1G). Subsequently, the semiconductor dies 110 can be mounted on a tape or film 126 (e.g., dicing tape) supported by a frame 128. In the illustrated embodiment, the second surface 120b of the reinforcement structure 118 is coupled to the tape 126 while the first surface 103a of the redistribution structure 100 is exposed. A dicing mechanism (e.g., a blade, saw, laser, etc.) can be used to cut through the portions of the redistribution structure 100, mold material 116, and reinforcement structure 118 between the individual semiconductor dies 110 to separate them from each other. The resulting singulated devices 150 can be subsequently separated from the tape 126 in accordance with techniques known to those of skill in the art.

Optionally, during the singulation process, a film layer (e.g., an anisotropic conductive film (ACF)—not shown) can be coupled between the tape 126 and the reinforcement structure 118, e.g., to facilitate adhesion. The film layer can extend continuously across all of the devices 150, or can be precut into individual sections corresponding to the size of an individual device 150.

In some embodiments, after singulation, one or more additional reinforcement structures (not shown) can be coupled around the lateral surfaces 152 of each device 150 to provide further support and protection. The additional reinforcement structures can be identical or generally similar to the reinforcement structure 118, and can be attached via laminating, coating, molding, or any other suitable technique.

FIG. 2 is a side cross-sectional view of a semiconductor device 200 configured in accordance with embodiments of the present technology. The device 200 can be manufactured using any embodiments of the methods provided herein, such as the method described with respect to FIG. 1A-1I. The device 200 includes a semiconductor die 110 mounted on a substrate 202. The components of the device 200 can be identical or generally similar to the corresponding components previously described with respect to FIGS. 1A-1I. For example, the semiconductor die 110 can be relatively thin (e.g., having a thickness less than or equal to 10 μm or 5 μm), and can have a first surface 114a (e.g., an active side or surface) coupled to a redistribution structure 100 and a second surface 114b (e.g., a back side or surface) coupled to a reinforcement structure 118 (e.g., a flexible reinforcement structure). The semiconductor die 110 can be electrically coupled to the substrate 202 via the redistribution structure 100 and an array of electrical connectors 124, thereby permitting signal transmission between the semiconductor die 110 and the substrate 202. Optionally, the semiconductor die 110 can be at least partially encapsulated by a mold material 116 between the reinforcement structure 118 and redistribution structure 100.

The substrate 202 can be any structure or component suitable for supporting the semiconductor die 110. For example, the substrate 202 can be or include an interposer, such as a printed circuit board, a dielectric spacer, another semiconductor die (e.g., a logic die), or another suitable substrate. In some embodiments, the substrate 202 is a flexible circuit or other suitable flexible substrate. Accordingly, the device 200 can be used in flexible electronics applications. In such embodiments, the device 200 can be configured to bend or otherwise deform while remaining fully operational (e.g., without mechanical and/or electrical failures). Optionally, the device 200 can be a "substrateless" package in which the substrate 202 is a circuit board-level substrate (e.g., a printed circuit board or flexible circuit), and the device 200 does not include any intermediate substrates (e.g., package-level substrates) between the semiconductor die 110 and the circuit board-level substrate.

Although the embodiments herein describe semiconductor devices having a single semiconductor die, the present technology can also be applied to semiconductor devices having a plurality of semiconductor dies that are vertically arranged in a die stack. Some or all of the semiconductor dies in the die stack can be relatively thin (e.g., having a thickness less than or equal to 10 µm or 5 µm). For example, some or all of the semiconductor dies can be sufficiently thin to accommodate non-TSV die stacking technologies. In such embodiments, one or more reinforcement structures can be coupled to the uppermost semiconductor die in the stack to provide protection against chipping, cracking, and/or thermomechanical stresses, as previously described. The reinforcement structure(s) can be attached to the uppermost semiconductor die (e.g., the semiconductor die furthest away from the redistribution structure) after the die stack has been assembled on a redistribution structure, in accordance with techniques known to those of skill in the art. Accordingly, the corresponding semiconductor device can include a first semiconductor die coupled to the reinforcement structure(s) and at least one second semiconductor die between the first semiconductor die and the redistribution structure.

Figure 3:
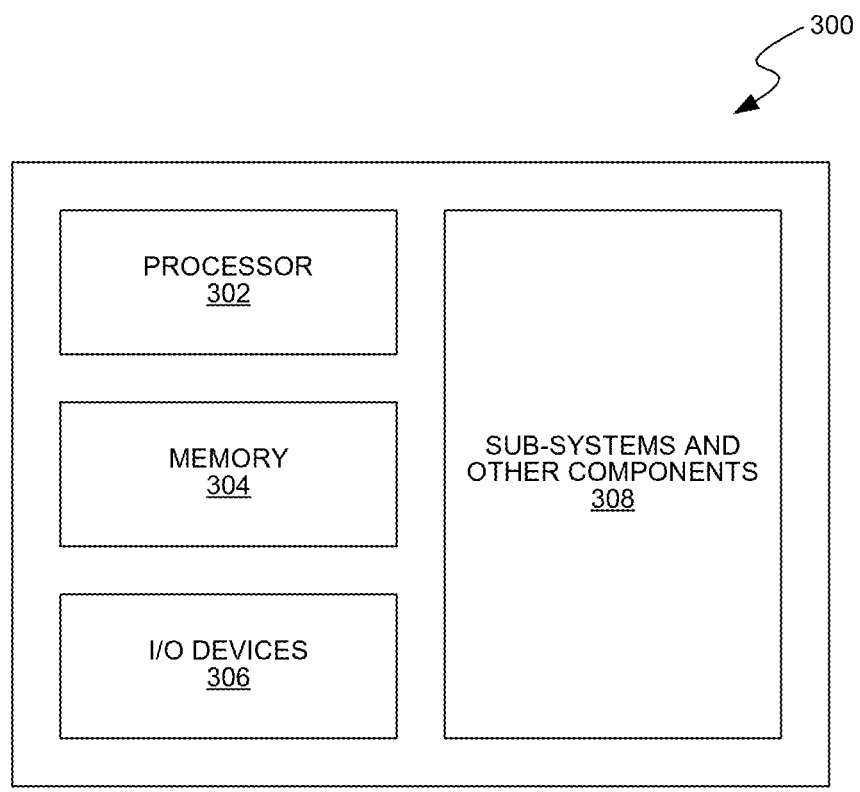
FIG. 3 is a schematic view of a system that includes a semiconductor device or package configured in accordance with embodiments of the present technology.

Any one of the semiconductor devices and/or packages having the features described above with reference to FIGS. 1A-2 can be incorporated into any of a myriad of larger and/or more complex systems, a representative example of which is system 300 shown schematically in FIG. 3. The system 300 can include a processor 302, a memory 304 (e.g., SRAM, DRAM, flash, and/or other memory devices), input/output devices 306, and/or other subsystems or components 308. The semiconductor dies and/or packages described above with reference to FIGS. 1A-2 can be included in any of the elements shown in FIG. 3. The resulting system 300 can be configured to perform any of a wide variety of suitable computing, processing, storage, sensing, imaging, and/or other functions. Accordingly, representative examples of the system 300 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 300 include lights, cameras, vehicles, etc. With regard to these and other example, the system 300 can be housed in a single unit or distributed over multiple interconnected units, e.g., through a communication network. The components of the system 300 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed:

1. A method of manufacturing a semiconductor device, the method comprising:
   electrically coupling a semiconductor die to a redistribution structure on a first carrier, the semiconductor die including a first surface facing the redistribution structure and a second surface spaced apart from the redistribution structure;
   reducing a thickness of the semiconductor die to no more than 10 µm;
   coupling a flexible reinforcement structure to the second surface of the semiconductor die;
   coupling the flexible reinforcement structure to a second carrier; and
   separating the redistribution structure from the first carrier.

2. The method of claim 1, further comprising:
   separating the flexible reinforcement structure from the second carrier; and
   electrically coupling the semiconductor die to a flexible circuit via an array of electrical connectors.

3. The method of claim 1 wherein the flexible reinforcement structure comprises a polymeric material, a resin, a laminate, or a film.

4. The method of claim 1 wherein the flexible reinforcement structure comprises a weave or a fiber, wherein the weave or the fiber are embedded in a matrix comprised of polymer or resin.

5. The method of claim 4, wherein the weave or the fiber are comprised of carbon or glass.

6. The method of claim 1, wherein the semiconductor die comprises a plurality of semiconductor dies, the method further comprising:
   singulating the plurality of semiconductor dies into a plurality of individual semiconductor devices.

7. The method of claim 1, wherein the first carrier and the redistribution structure are coupled by a release layer between the first carrier and the redistribution structure, the method further comprising:
   separating the first carrier from the redistribution structure by dissolving the release layer or debonding the release layer from the redistribution structure.

8. The method of claim 1, further comprising:
   forming a mold material over the semiconductor die and the redistribution structure,
   wherein reducing the thickness of the semiconductor die includes removing a portion of the mold material to expose the second surface of the semiconductor die.

9. A method of manufacturing a semiconductor device, the method comprising:
   electrically coupling a first semiconductor die to a redistribution structure on a first carrier, the first semiconductor die including a first surface facing the redistribution structure and a second surface spaced apart from the redistribution structure;
   reducing a thickness of the first semiconductor die to no more than 10 µm;
   coupling a flexible reinforcement structure to the second surface of the first semiconductor die; and
   coupling a second semiconductor die to the first surface of the first semiconductor die, wherein the second semiconductor die is positioned between the first semiconductor die and the redistribution structure.

10. The method of claim 9, further comprising:
coupling the redistribution structure and the first semiconductor die to a flexible circuit.

11. The method of claim 9 wherein the flexible reinforcement structure comprises a weave or a fiber, wherein the weave or the fiber are embedded in a matrix comprised of polymer or resin.

12. The method of claim 9, wherein the first semiconductor die comprises a plurality of semiconductor dies, the method further comprising:
singulating the plurality of semiconductor dies into a plurality of individual semiconductor devices.

13. The method of claim 9, wherein the first carrier and the redistribution structure are coupled by a release layer between the first carrier and the redistribution structure, the method further comprising:
separating the first carrier from the redistribution structure by dissolving the release layer or debonding the release layer from the redistribution structure.

14. The method of claim 9, further comprising:
forming a mold material over the first semiconductor die and the redistribution structure,
wherein reducing the thickness of the first semiconductor die includes removing a portion of the mold material to expose the second surface of the first semiconductor die.

15. A method of manufacturing a semiconductor device, the method comprising:
electrically coupling a semiconductor die to a redistribution structure on a first carrier, the semiconductor die including a first surface facing the redistribution structure and a second surface spaced apart from the redistribution structure;
reducing a thickness of the semiconductor die to no more than 10 μm;
coupling a first flexible reinforcement structure to the second surface of the semiconductor die; and
coupling a second flexible reinforcement structure to the first flexible reinforcement structure.

16. The method of claim 15, wherein the first flexible reinforcement structure comprises a weave or a fiber, wherein the weave or the fiber are embedded in a matrix comprised of polymer or resin.

17. The method of claim 15, wherein the semiconductor die comprises a plurality of semiconductor dies, the method further comprising:
singulating the plurality of semiconductor dies into a plurality of individual semiconductor devices.

18. The method of claim 15, wherein the first carrier and the redistribution structure are coupled by a release layer between the first carrier and the redistribution structure, the method further comprising:
separating the first carrier from the redistribution structure by dissolving the release layer or debonding the release layer from the redistribution structure.

19. The method of claim 15, further comprising:
forming a mold material over the semiconductor die and the redistribution structure,
wherein reducing the thickness of the semiconductor die includes removing a portion of the mold material to expose the second surface of the semiconductor die.

20. The method of claim 15, wherein the first flexible reinforcement structure has a thickness of no more than 10 μm.

* * * * *